United States Patent
Du et al.

(10) Patent No.: US 10,197,390 B2
(45) Date of Patent: Feb. 5, 2019

(54) PRE-ALIGNMENT MEASUREMENT DEVICE AND METHOD

(71) Applicant: SHANGHAI MICRO ELECTRONICS EQUIPMENT (GROUP) CO., LTD., Shanghai (CN)

(72) Inventors: Rong Du, Shanghai (CN); Dawei Yu, Shanghai (CN); Chenhui Yu, Shanghai (CN)

(73) Assignee: SHANGHAI MICRO ELECTRONICS EQUIPMENT (GROUP) CO., LTD., Shanghai (CN)

( * ) Notice: Subject to any disclaimer, the term of this patent is extended or adjusted under 35 U.S.C. 154(b) by 0 days.

(21) Appl. No.: 15/540,909

(22) PCT Filed: Dec. 30, 2015

(86) PCT No.: PCT/CN2015/099749
§ 371 (c)(1),
(2) Date: Jun. 29, 2017

(87) PCT Pub. No.: WO2016/107573
PCT Pub. Date: Jul. 7, 2016

(65) Prior Publication Data
US 2017/0350696 A1    Dec. 7, 2017

(30) Foreign Application Priority Data
Dec. 31, 2014  (CN) .......................... 2014 1 0845231

(51) Int. Cl.
*G01B 11/27*  (2006.01)
*G03F 9/00*  (2006.01)

(52) U.S. Cl.
CPC .......... *G01B 11/272* (2013.01); *G03F 9/7011* (2013.01); *G03F 9/7088* (2013.01)

(58) Field of Classification Search
CPC ... G01B 11/272; G01B 11/028; G03F 9/7088; G03F 7/70625; G03F 7/70633; H01L 21/681–21/682; B23K 26/032
See application file for complete search history.

(56) References Cited

U.S. PATENT DOCUMENTS 5,414,515 A * 5/1995 Kawashima .......... G03F 9/7026
356/400
5,440,394 A * 8/1995 Nose .................... G03F 7/70616
250/548

(Continued)

FOREIGN PATENT DOCUMENTS

CN    102087483 A    6/2011
CN    102243138 A    11/2011

(Continued)

*Primary Examiner* — Dominic J Bologna
(74) *Attorney, Agent, or Firm* — Muncy, Geissler, Olds & Lowe, P.C.

(57) ABSTRACT

A pre-alignment measurement device includes, disposed in a direction of propagation of light, a laser, a first cylindrical lens, a first imaging lens, an illumination diaphragm, a second imaging lens, a second cylindrical lens and a CCD detector. The laser, an object under measurement and the CCD detector are arranged at respective apexes of a triangle formed by the measurement device for pre-alignment. A light beam is emanated by the laser and is transformed into a line beam. The line beam is reflected by the object under measurement and then passes through the second cylindrical lens to form a CCD image which has different horizontal and vertical magnifications, allowing horizontal and vertical resolutions to be matched with horizontal and vertical measuring ranges, respectively. The CCD image contains information of a position and a height of a step defined by the object under measurement and the wafer stage.

9 Claims, 6 Drawing Sheets

(56) References Cited

U.S. PATENT DOCUMENTS

| | | | | |
|---|---|---|---|---|
| 5,625,453 | A * | 4/1997 | Matsumoto | G03F 7/70633 356/488 |
| 6,046,812 | A * | 4/2000 | Baik | G01B 11/25 250/559.23 |
| 6,162,008 | A * | 12/2000 | Perkins | G01B 11/24 198/394 |
| 7,042,568 | B2 * | 5/2006 | Mayo | H01L 21/681 250/559.29 |
| 2003/0230749 | A1 * | 12/2003 | Isobe | B23K 26/032 257/59 |
| 2007/0045566 | A1 * | 3/2007 | McGinley | G01B 11/272 250/491.1 |
| 2009/0091723 | A1 * | 4/2009 | Sasaki | B82Y 10/00 355/53 |
| 2009/0153868 | A1 * | 6/2009 | Sawabe | B23K 26/032 356/445 |

FOREIGN PATENT DOCUMENTS

| | | |
|---|---|---|
| CN | 102540778 A | 7/2012 |
| CN | 103543610 A | 1/2014 |
| JP | H0766120 | 3/1995 |

* cited by examiner

PRE-ALIGNMENT MEASUREMENT DEVICE AND METHOD

TECHNICAL FIELD

The present invention relates to the field of integrated circuit (IC) fabrication equipment and, more particularly, to a measurement device and method for pre-alignment of lithographic wafers and substrates.

BACKGROUND

Photolithography tools are indispensable in the manufacturing of microelectronic devices. As a photolithography tool typically has a very limited field of view, before a wafer is exposed on a stage of the photolithography tool, it must be pre-aligned in order to be located within the field of view of the photolithography tool. Therefore, pre-alignment of the wafer constitutes an important part of the exposure process performed by the photolithography tool on the wafer.

Generally, pre-alignment can be done in a mechanical or optical manner. Optical pre-alignment can provides a higher precision over the mechanical approach, but it is expensive. An optical pre-alignment process involves detecting an edge and notch in the wafer using precision optics, centering the wafer according to an algorithm and detecting the wafer using linear charge-coupled devices (CCDs) as sensors.

Commonly-used devices for optical pre-alignment can be divided into two types.

The first type is worked in a transmissive manner, as shown in FIG. 1, a lighting unit and an imaging unit are arranged on both sides of an object under measurement, i.e., the wafer. As the object under measurement does not allow transmission of light, its boundary can be imaged on the CCD detector, and the position (e.g., including vertical and horizontal) and attitude (e.g., a tilt) of the wafer can be calculated based on an image of the boundary. In practical use, this approach is mainly associated with two issues: 1) when the object under measurement is a bonded wafer with its notch or flat remaining untreated, the light will be blocked and the wafer's attitude cannot be ascertained; and 2) the image quality is poor for glass substrates.

Another type is worked in a reflective manner, as shown in FIG. 2, the wafer notch can be identified by taking advantage of different reflectivities of the substrate (i.e., a carrier wafer) and wafer. However, the reflective pre-alignment device is associated with two major issues: 1) there are usually small profile irregularities at the wafer notch resulting from the bonding or other processes, which tend to impair the imaging quality and reliability of the device; and 2) the reflective pre-alignment device is susceptible to interference. After the wafer is placed on a chuck 1, as shown in FIG. 3, annular grooves 1a, 1b and 1c in the chuck 1 will also be imaged on the CCD detector, making it difficult to identify the wafer edge from the captured image (as shown in FIG. 4).

Patent Publication No. CN102402127A, entitled "Wafer Pre-aligner and Method Therefor", provides a measurement device utilizing a height difference. However, this device does not take into account the relationship between vertical and horizontal magnifications and is hence insufficient in resolution. In addition, the calibration disclosed in the patent fails to provide horizontal measurements.

SUMMARY OF THE INVENTION

In order to overcome the drawbacks of the prior art, the present invention proposes a measurement device for pre-alignment, including, disposed in a direction of propagation of light, a laser, a first cylindrical lens, a first imaging lens, an illumination diaphragm, a second imaging lens, a second cylindrical lens and a CCD detector, wherein: an object under measurement is arranged between the first cylindrical lens and the first imaging lens and is carried by a wafer stage; the laser, the object under measurement and the CCD detector are arranged at respective apexes of a triangle formed by the measurement device for pre-alignment; a plane of the triangle is perpendicular to a plane of the object under measurement and is tangent to an edge of the object under measurement; a light beam is emanated by the laser and is transformed into a line beam after passing through the first cylindrical lens; and the line beam is reflected by the object under measurement and then passes through the second cylindrical lens to form a CCD image which has different horizontal and vertical magnifications, thereby allowing horizontal and vertical resolutions to be matched with horizontal and vertical measuring ranges, respectively, the CCD image containing information of a position and a height of a step defined by the object under measurement and the wafer stage.

The measurement device may further include a calibration mark plate disposed in the wafer stage such that a top surface of the calibration mark plate is flush with a top surface of the wafer stage.

A calibrating mark provided on the calibration mark plate may be composed of two rectangular patterns having different reflectivities.

A method for calibrating a position of a wafer stage with a calibrating mark is also disclosed, using a measurement device for pre-alignment including, disposed in a direction of propagation of light, a laser, a first cylindrical lens, a first imaging lens, an illumination diaphragm, a second imaging lens, a second cylindrical lens and a CCD detector, the wafer stage carrying an object under measurement that is arranged between the first cylindrical lens and the first imaging lens, the laser, the object under measurement and the CCD detector being arranged at respective apexes of a triangle formed by the measurement device for pre-alignment, a plane of the triangle is perpendicular to a plane of the object under measurement and is tangent to an edge of the object under measurement, the method including the steps of:

1) incrementally moving the wafer stage in a z-direction;
2) from each vertical position $z_i$, incrementally moving the wafer stage in an x-direction;
3) at each specific position, emanating a light beam by the laser, transforming the light beam into a line beam by the first cylindrical lens, irradiating the line beam onto the object under measurement on the wafer stage, detecting a reflected line segment from the object under measurement in a CCD image, the reflected line segment having different horizontal and vertical magnifications due to the second cylindrical lens, thereby allowing horizontal and vertical resolutions to be matched with horizontal and vertical measuring ranges, respectively, obtaining multiple positions of the reflected line segment in the CCD image and determining position ($u_i$, $v_i$) of an intersection point, wherein u and v represent horizontal and vertical coordinates in a coordinate system of the CCD image, and i is a positive integer;
4) recording positions ($x_i$, $z_i$) of points on the wafer stage corresponding the positions ($u_i$, $v_i$), wherein $z_i$ represents vertical positions where the wafer stage is located during detection of the positions ($u_i$, $v_i$), and $x_i$ denotes positions of a mark intersection point in a wafer-stage coordinate system originated at a zero position determined by summing horizontal positions where the wafer stage is located during detection of the positions ($u_i$, $v_i$) and respective positions of the mark intersection point in the wafer-stage coordinate system; and 5) correlating the positions ($u_i$, $v_i$) of the intersection point in the CCD images and the positions ($x_i$, $z_i$) of the mark intersection point in the wafer-stage coordinate system.

In step 3), the multiple positions of the reflected line segment in the CCD image may be detected by a straight-line detection algorithm.

In step 3), determining the position ($u_i$, $v_i$) of the intersection point may include: extracting a CCD detector gray value corresponding to each point, from a start point to an end point, of the reflected line segment, based on positions of points in the reflected line segment, so as to plot a one-dimensional gray distribution curve for the calibrating mark; and determining the position ($u_i$, $v_i$) of the intersection point from the one-dimensional gray distribution curve using a gradient extremal method.

A measurement method for a pre-alignment measurement device includes the steps of:

1) obtaining the correlation between the positions ($u_i$, $v_i$) of the intersection point in the CCD images and the positions ($x_i$, $z_i$) of the intersection point in the wafer-stage coordinate system by using the method as defined above;

2) calculating positions ($u_j$, $v_j$) of N step change points for the object under measurement and the wafer stage on which the object under measurement is carried, wherein u and v represent horizontal and vertical coordinates in a coordinate system of the CCD images, and j is a positive integer in the range from 1 to N;

3) calculating, by interpolation, a height difference $\Delta Z_j$ and an x-positional coordinate $X_j$ for each of the N step change points based on the correlation between the positions ($u_i$, $v_i$) of the intersection point in the CCD images and the positions ($x_i$, $z_i$) of the intersection point in the wafer-stage coordinate system obtained in step 1);

4) determining, based on a nominal thickness of the object under measurement, a position ($X_k$, $\Delta Z_k$) of one of the N step change points that represents an edge of the object under measurement, wherein k is a positive integer in a range from 1 to N; and 5) determining, based on the position of the edge of the object under measurement, a center position of the object under measurement, thereby accomplishing the pre-alignment by the pre-alignment measurement device.

Compared to the prior art, a height difference between the object under measurement and the carrier is calculated and compared to a nominal thickness of the object under measurement, in accordance with the present invention. This can eliminate the interference from chuck grooves for wafer alignment and allows pre-alignment of bonded wafers in a more reliable way, while ensuring the matching of horizontal and vertical resolutions.

BRIEF DESCRIPTION OF THE DRAWINGS

The advantages and spirit of the present invention can be further understood from the following detail description and from the accompanying drawings.

DETAILED DESCRIPTION

The present invention will be described below in detail with reference to the accompanying drawings.

Figure 1:
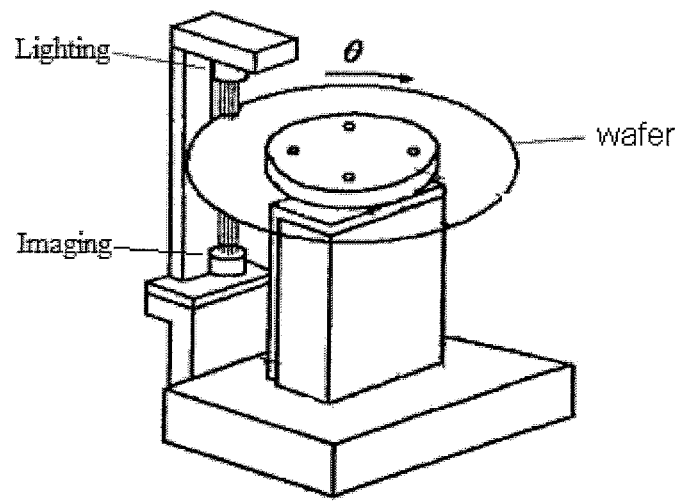
FIG. 1 is a structural schematic of a conventional transmissive pre-aligner.
Figure 2:
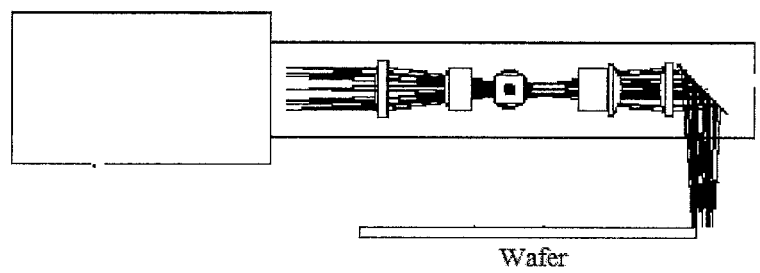
FIG. 2 is a structural schematic of a conventional reflective pre-aligner.
Figure 3:
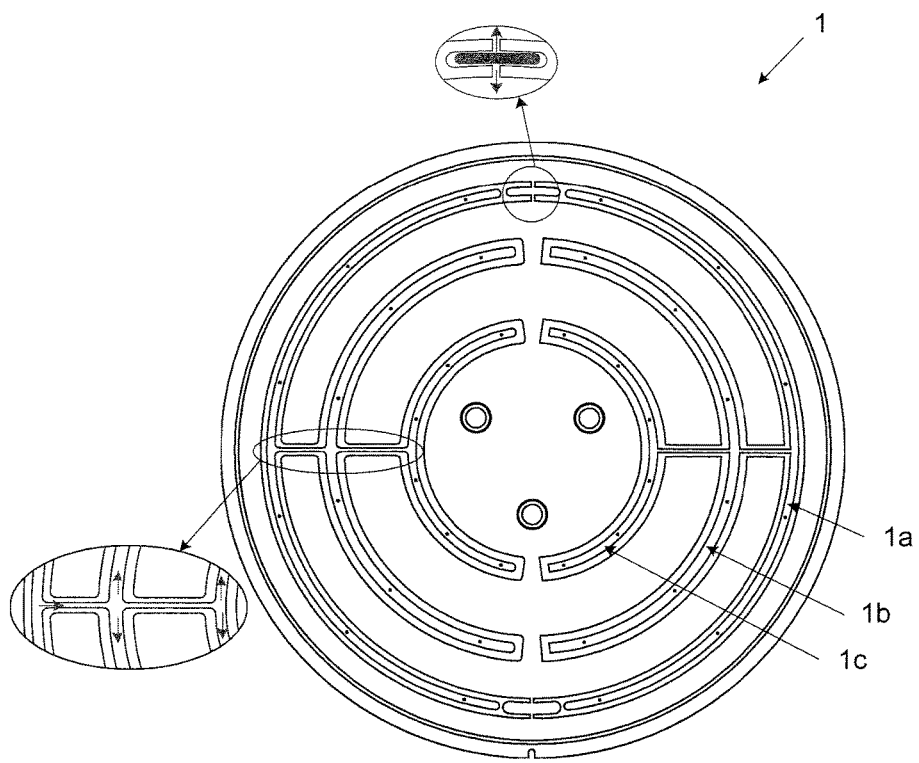
FIG. 3 schematically illustrates annular grooves in a chuck.
Figure 4:
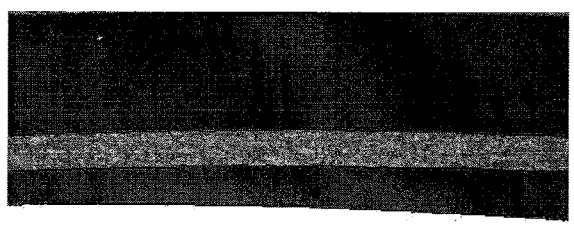
FIG. 4 shows an image of the annular grooves captured by a CCD detector.
Figure 4:
Figure 5:
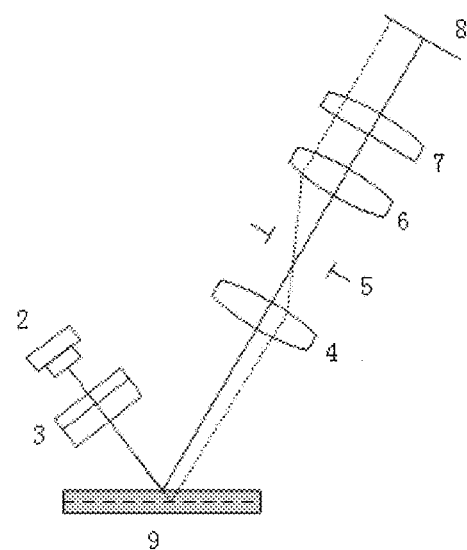
FIG. 5 is a structural schematic of a measurement device for pre-alignment according to the present invention.
Figure 6:
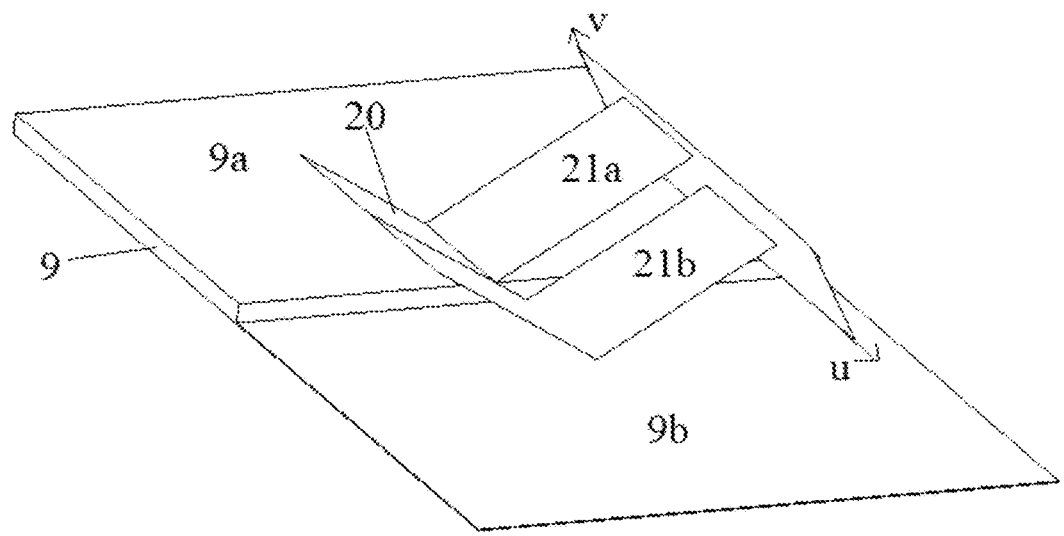
FIG. 6 schematically shows imaging by light from a step.

FIG. 5 is a structural schematic of a measurement device for pre-alignment according to the present invention. As shown in FIG. 5, the device is composed of a laser 2, a first cylindrical lens 3, a first imaging lens 4, an illumination diaphragm 5, a second imaging lens 6, a second cylindrical lens 7 and a CCD detector 8. Light emanated from the laser 2 is shaped into a line beam by the first cylindrical lens 3 and then illuminates an object under measurement 9 having a step (height difference). The object under measurement may be a conventional wafer, in particular bonded wafers or a glass substrate. The step is defined by an edge portion of the object under measurement and the surface of a carrier. After being reflected by the object under measurement 9, the light beam forms an image which is then enlarged after the light beam successively passing through the first imaging lens 4 and the second imaging lens 6. The directions u and v in the image plane reflect the position and height of the step, respectively. Specifically, reference can be made to, for example, FIG. 6, a diagram showing different locations of the images of the light beam resulted from the step. After the incident light 20 is reflected at the step, two reflected light beams 21a and 21b are formed. The step is defined by the height difference between the surface 9a of the object under measurement and the surface 9b of the carrier (e.g., a chuck). The reflected light beam 21a results from reflection of the incident light 20 by the surface 9a of the object under measurement, and the reflected light beam 21b results from reflection of the incident light 20 by the surface 9b of the carrier. As can be seen from FIG. 6, the u-direction of the image contains positional information of the step between the object under measurement 9 and the carrier, i.e., information about the position of the edge portion of the object under measurement 9. The v-direction of the image carries height information of the step between the object under measurement 9 and the carrier, i.e., information about a thickness of the object under measurement 9. As the two directions are imposed with different precision and field of view requirements, the second cylindrical lens 7 is provided downstream to the second imaging lens 6 in order to enable different magnifications in the u and v directions. The light finally reaches a detecting surface of the CCD detector 8.

The different magnifications in the u and v directions allow horizontal and vertical resolutions to be matched with measuring ranges in these directions.

The object under measurement 9 is, for example, a wafer or a glass substrate. This embodiment is described with it being a wafer as an example. The surface of the object under measurement 9 may be either a smooth or rough surface. In order to reduce the influence of diffracted light occurring in scenarios where the surface is rough, the illumination diaphragm 5 is disposed downstream to the first imaging lens 4.

In order to carry out the measurement for pre-alignment, the position of the carrier, i.e., the position of a wafer stage, is first calibrated. The aforementioned chuck is the portion of the wafer stage that comes into direct contact with the object under measurement.

Figure 7:
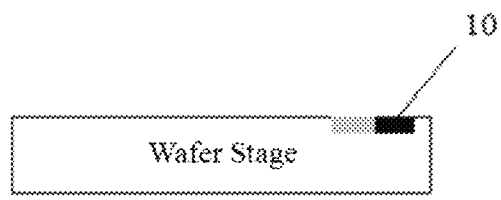
FIG. 7 is a schematic illustration of a calibration mark plate in a wafer stage.
Figure 8:
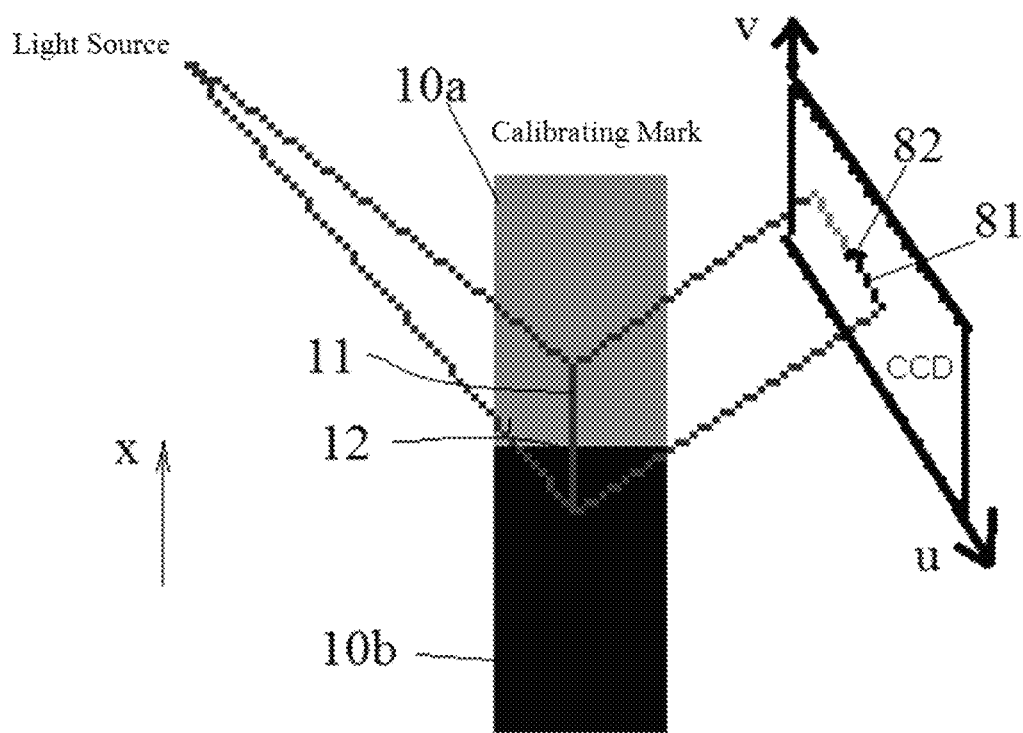
FIG. 8 schematically shows imaging of the calibration mark plate.
Figure 9:
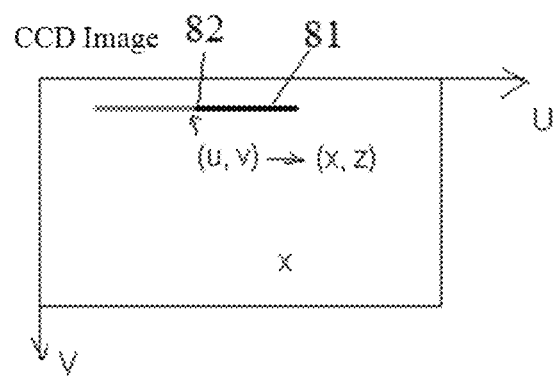
FIG. 9 shows an image of the calibration mark plate on a CCD detector.

As shown in FIG. 7, a calibration mark plate 10 is disposed in the wafer stage such that the top surface of the calibration mark plate 10 is flush with that of the wafer stage. As shown in FIG. 8, the calibration mark plate is made up of two bonded patterns 10a, 10b differing from each other considerably in reflectance. In order to facilitate fabrication and detection by CCDs, in this embodiment, the two patterns 10a, 10b are shaped into rectangles. However, the present invention is not limited in this regard, as the patterns may also assume other suitable shapes. A light beam emitted from the line laser is reflected at the calibration mark plate 10 and finally forms an image on the CCD detector. Assuming the light beam from the line laser illuminates the calibration mark plate 10 in the form of a line segment 11 and, as shown in FIGS. 8 and 9, the line segment 11 crosses a boundary between the patterns 10a and 10b at an intersection point 12, as a result of reflection by the calibration mark plate 10, the light beam forms an image on the CCD detector, which is a line segment 81 containing an intersection point 82 that corresponds to the intersection point 12.

The intersection point 12 in the wafer stage corresponds to the intersection point 82 in the CCD image in such a manner that upon a change in the height of the wafer stage, i.e., in the z-position of the wafer stage, the v-position of the intersection point 82 in the CCD image varies accordingly. In addition, when the wafer stage is horizontally moved in the x-direction, the intersection point 82 in the CCD image moves in the u-direction.

Based on such correspondence, a correlation between the intersection point 82 in the CCD image (represented, for example, by coordinates (u, v)) and the intersection point 12 in the wafer stage (represented, for example, by coordinates (x, z)) can be established by means of a calibration process including a series of steps.

Figure 10:
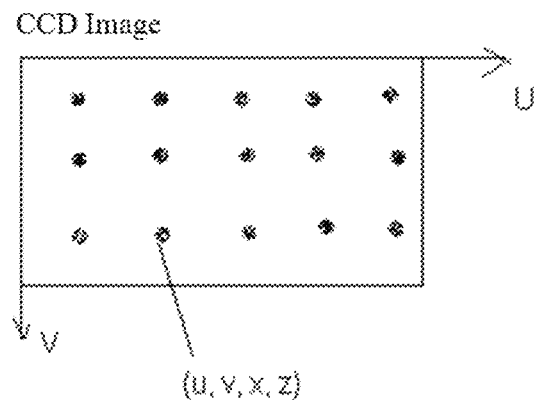
FIG. 10 shows calibrated positions.

The calibration process majorly includes:

Step 1: incrementally moving the wafer stage vertically, i.e., in the z-direction;

Step 2: from each vertical position $z_i$, incrementally moving the wafer stage horizontally, i.e., in the x-direction;

Step 3: at each specific position, detecting the reflected line segment of the laser light, obtaining the position of the line segment in the CCD image and determining the position $(u_i, v_i)$ of the intersection point 82, where i is a positive integer;

Step 4: for each position $(u_i, v_i)$ of the intersection point, recording the position $(x_i, z_i)$ of the corresponding intersection point in the wafer stage, wherein $z_i$ represents the vertical position where the wafer stage is located at the moment when $(u_i, v_i)$ is detected, and $x_i$ denotes the position of the intersection point 12 in a coordinate system originated at a zero position of the wafer stage determined by summing the horizontal position where the wafer stage is located at the moment when $(u_i, v_i)$ is detected and the position of the intersection point 12 in the wafer-stage coordinate system. The calibrated positions are shown in FIG. 10. As such, a correlation between the positions $(u_i, v_i)$ of the intersection point 82 in the CCD images and the positions $(x_i, z_i)$ of the intersection point 12 in the wafer-stage coordinate system is established by means of the calibration process.

In Step 3 of the calibration process, the position of the line segment can be detected using a straight-line detection algorithm (e.g., LSD: A Fast Line Segment Detector with a False Detection Control" by Rafael Grompone von Gioi, Jeremie Jakubowicz, Jean-Michel Morel, and Gregory Randall, IEEE Transactions on Pattern Analysis and Machine Intelligence, Vol. 32, No. 4, pp. 722-732, April, 2010).

Figure 11:
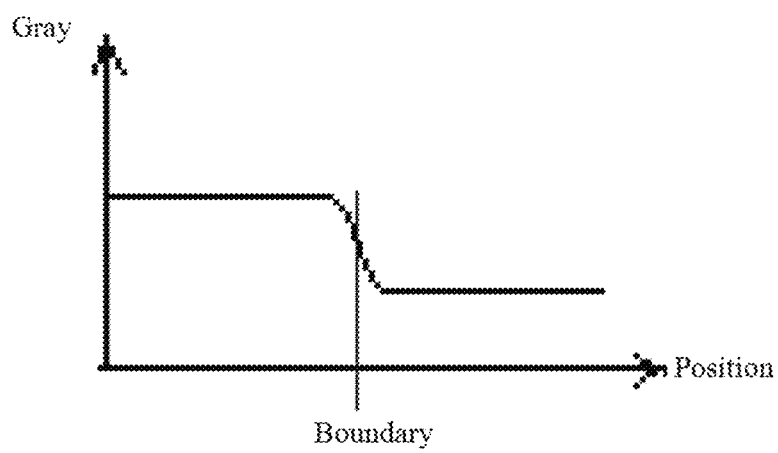
FIG. 11 shows a one-dimensional gray distribution curve of a calibrating mark.

In Step 3 of the calibration process, based on the detected position of the line segment, for each point therein from start to finish, a corresponding gray value on the CCD detector is extracted to plot a one-dimensional gray distribution curve for the calibrating mark, as shown in FIG. 11. From the gray distribution curve, the position $(u_i, v_i)$ of the intersection point 82 between the two materials can be determined using a gradient extremal method.

Figure 12:
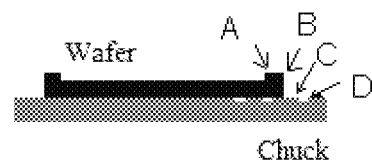
FIG. 12 schematically shows wafer pre-alignment according to the present invention.
Figure 13:
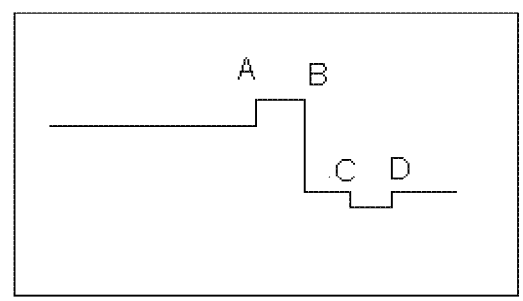
FIG. 13 shows an image formed in the wafer pre-alignment according to the present invention.

As shown in FIG. 12, with the object under measurement (e.g., a wafer) being placed on the carrier (e.g., a chuck of a wafer stage), a CCD image, as shown in FIG. 13, is formed when the line laser light is irradiated thereon. The positions $(u_i, v_i)$ of points A, B, C, D in the CCD image representing step changes are then calculated. Based on data recorded during the calibration, positions $(x_i, z_i)$ in the wafer-stage coordinate system each corresponding to one of the points can be determined. After that, the height difference $\Delta z_j$ between every two of the points are calculated, i.e., $\Delta z_1 = \Delta z_B - \Delta z_A$, $\Delta z_2 = \Delta z_C - \Delta z_B$ and $\Delta z_3 = \Delta z_D - \Delta z_C$.

The one of the $\Delta z_j$ whose absolute value is closest to a nominal thickness of the wafer ($\Delta z_2$ in this embodiment) is selected, so that it is determinable that the step defined by the object under measurement and the carrier is located at one of the two points corresponding to $\Delta z_2$, i.e., the points B and C. Further, from a comparison between the z-values of the points B and C, it is determinable that point B is the one among the points that presents the wafer edge, and its positional data $(x_B, z_B)$ may also be determined.

Further, based on the position of the wafer edge, the position of a center of the wafer can also be determined by circular or rectangular fitting.

Disclosed herein are merely several preferred particular embodiments of the present invention, which are intended to explain the subject matter of the invention rather than limit the scope thereof. All embodiments made by those skilled in the art by means of logical analysis, reference or limited experimentation based on the teachings of the invention are embraced within the scope thereof.

What is claimed is:

1. A measurement device for pre-alignment, comprising, disposed in a direction of propagation of light, a laser, a first cylindrical lens, a first imaging lens, an illumination diaphragm, a second imaging lens, a second cylindrical lens and a CCD detector, wherein: an object under measurement is arranged between the first cylindrical lens and the first imaging lens in the direction of propagation of light and is carried by a wafer stage; a light beam is emanated by the laser and is transformed into a line beam after passing through the first cylindrical lens; and the line beam illuminates an edge of the object under measurement and is reflected by the object under measurement and then passes through the second cylindrical lens to form a CCD image which has different horizontal and vertical magnifications, thereby allowing horizontal and vertical resolutions to be matched with horizontal and vertical measuring ranges, respectively, the CCD image containing information of a position and a height of a step defined by the edge of the object under measurement and the wafer stage.

2. The measurement device for pre-alignment according to claim 1, further comprising a calibration mark plate disposed in the wafer stage such that a top surface of the calibration mark plate is flush with a top surface of the wafer stage.

3. The measurement device for pre-alignment according to claim 2, wherein a calibrating mark provided on the calibration mark plate is composed of two rectangular patterns having different reflectivities.

4. A method for calibrating a position of a wafer stage with a calibrating mark, using a measurement device for pre-alignment comprising, disposed in a direction of propagation of light, a laser, a first cylindrical lens, a first imaging lens, an illumination diaphragm, a second imaging lens, a second cylindrical lens and a CCD detector, the calibrating mark of the wafer stage being arranged between the first cylindrical lens and the first imaging lens in the direction of propagation of light, the calibrating mark including two patterns having different reflectivities and defining a boundary between the two patterns, the method comprising the steps of:

1) incrementally moving the wafer stage in a z-direction;
2) from each vertical position $z_i$, incrementally moving the wafer stage in an x-direction;
3) at each specific position, emanating a light beam by the laser, transforming the light beam into a line beam by the first cylindrical lens, irradiating the line beam onto the calibrating mark on the wafer stage such that the line beam crosses the boundary between the patterns of the calibrating mark so as to form a mark intersection point on the wafer stage, detecting a reflected line segment from the calibrating mark in a CCD image, the reflected line segment having different horizontal and vertical magnifications due to the second cylindrical lens, thereby allowing horizontal and vertical resolutions to be matched with horizontal and vertical measuring ranges, respectively, obtaining multiple positions of the reflected line segment in the CCD image and determining position $(u_i, v_i)$ of an intersection point in the reflected line segment that corresponds to the mark intersection point on the wafer stage, wherein u and v represent horizontal and vertical coordinates in a coordinate system of the CCD image, and i is a positive integer;
4) recording positions $(x_i, z_i)$ of mark intersection points on the wafer stage corresponding the positions $(u_i, v_i)$, wherein $z_i$ represents vertical positions where the wafer stage is located during detection of the positions $(u_i, v_i)$, and $x_i$ denotes positions of the mark intersection point in a wafer-stage coordinate system originated at a zero position determined by summing horizontal positions where the wafer stage is located during detection of the positions $(u_i, v_i)$ and respective positions of the mark intersection point in the wafer-stage coordinate system; and
5) correlating the positions $(u_i, v_i)$ of the intersection point in the CCD images and the positions $(x_i, z_i)$ of the mark intersection point in the wafer-stage coordinate system.

5. The method according to claim 4, wherein in step 3), the multiple positions of the reflected line segment in the CCD image is detected by a straight-line detection algorithm.

6. The method according to claim 4, wherein in step 3), determining the position $(u_i, v_i)$ of the intersection point comprises: extracting a CCD detector gray value corresponding to each point, from a start point to an end point, of the reflected line segment, based on positions of points in the reflected line segment, so as to plot a one-dimensional gray distribution curve for the calibrating mark; and determining the position $(u_i, v_i)$ of the intersection point from the one-dimensional gray distribution curve using a gradient extremal method.

7. A measurement method for a pre-alignment measurement device, comprising the steps of:

1) obtaining a correlation between the positions $(u_i, v_i)$ of the intersection point in the CCD images and the positions $(x_i, z_i)$ of the intersection point in the wafer-stage coordinate system by using the method as defined in claim 4;
2) calculating positions $(u_j, v_j)$ of N step change points for an object under measurement and the wafer stage on which the object under measurement is carried, wherein u and v represent horizontal and vertical coordinates in a coordinate system of the CCD images, and j is a positive integer in a range from 1 to N;
3) calculating, by interpolation, a height difference $\Delta Z_j$ and an x-positional coordinate $X_j$ for each of the N step change points based on the correlation between the positions $(u_i, v)$ of the intersection point in the CCD images and the positions $(x_i, z_i)$ of the intersection point in the wafer-stage coordinate system obtained in step 1);
4) determining, based on a nominal thickness of the object under measurement, a position $(X_k, \Delta Z_k)$ of one of the N step change points that represents an edge of the object under measurement, wherein k is a positive integer in a range from 1 to N; and
5) determining, based on the position of the edge of the object under measurement, a center position of the object under measurement, thereby accomplishing the pre-alignment by the pre-alignment measurement device.

8. The measurement method for a pre-alignment measurement device according to claim 7, wherein in step 2), N is 4.

9. The measurement method for a pre-alignment measurement device according to claim 8, wherein in step 4), coordinates of the center position of the object under measurement are determined by circular or rectangular fitting.

* * * * *